(12) United States Patent
Tatsumi

(10) Patent No.: US 11,152,286 B2
(45) Date of Patent: Oct. 19, 2021

(54) POWER SEMICONDUCTOR MODULE DEVICE

(71) Applicant: WASEDA UNIVERSITY, Tokyo (JP)

(72) Inventor: Kohei Tatsumi, Tokyo (JP)

(73) Assignee: WASEDA UNIVERSITY, Tokyo (JP)

( * ) Notice: Subject to any disclaimer, the term of this patent is extended or adjusted under 35 U.S.C. 154(b) by 2 days.

(21) Appl. No.: 16/254,049

(22) Filed: Jan. 22, 2019

(65) Prior Publication Data

US 2019/0198428 A1 Jun. 27, 2019

Related U.S. Application Data

(63) Continuation of application No. PCT/JP2018/019354, filed on May 18, 2018.

(30) Foreign Application Priority Data

May 19, 2017 (JP) ................. 2017-099869

(51) Int. Cl.

| H01L 23/00 | (2006.01) |
|---|---|
| H01L 23/482 | (2006.01) |
| H01L 23/12 | (2006.01) |
| H01L 23/492 | (2006.01) |
| H01L 21/56 | (2006.01) |
| H01L 23/367 | (2006.01) |
| H01L 25/00 | (2006.01) |

(Continued)

(52) U.S. Cl.
CPC ........ *H01L 23/482* (2013.01); *H01L 21/4853* (2013.01); *H01L 21/561* (2013.01); *H01L 23/12* (2013.01); *H01L 23/367* (2013.01); *H01L 23/492* (2013.01); *H01L 23/5389* (2013.01); *H01L 25/07* (2013.01); *H01L 25/072* (2013.01); *H01L 25/18* (2013.01); *H01L 25/50* (2013.01)

(58) Field of Classification Search
None
See application file for complete search history.

(56) References Cited

U.S. PATENT DOCUMENTS

2007/0290782 A1 12/2007 Yokoyama et al.
2013/0241040 A1 9/2013 Tojo et al.
(Continued)

FOREIGN PATENT DOCUMENTS

| JP | 2007-335473 A | 12/2007 |
|---|---|---|
| JP | 2008-004612 A | 1/2008 |

(Continued)

OTHER PUBLICATIONS

International Search Report issued in Application No. PCT/JP2018/019354, dated Aug. 7, 2018.

*Primary Examiner* — Reema Patel
(74) *Attorney, Agent, or Firm* — Michael Best & Friedrich LLP

(57) ABSTRACT

A power semiconductor module device includes: a plurality of semiconductor elements that are arranged at intervals and flush with each other on a plane; an insulating support that fixes the semiconductor elements; a first thick-film plating layer that is formed as a first-surface-side electrode that electrically connects the semiconductor elements to each other on at least one surface of a front surface side and a rear surface side. The first thick-film plating layer supports the semiconductor elements from at least one of an upper direction and a lower direction.

8 Claims, 13 Drawing Sheets

(51) Int. Cl.
- *H01L 21/48* (2006.01)
- *H01L 25/07* (2006.01)
- *H01L 25/18* (2006.01)
- *H01L 23/538* (2006.01)

(56) References Cited

U.S. PATENT DOCUMENTS

| | | | | |
|---|---|---|---|---|
| 2014/0103519 A1* | 4/2014 | Steger | ............ | H01L 23/5385 |
| | | | | 257/734 |
| 2014/0124915 A1* | 5/2014 | Hayashi | ............ | H01L 25/18 |
| | | | | 257/713 |
| 2015/0223316 A1* | 8/2015 | Fujino | ............ | H01L 24/37 |
| | | | | 361/717 |
| 2017/0148770 A1* | 5/2017 | Ishino | ............ | H01L 23/492 |

FOREIGN PATENT DOCUMENTS

| | | |
|---|---|---|
| JP | 2013-219324 A | 10/2013 |
| JP | 2014-179429 A | 9/2014 |
| WO | WO-2015/053356 A1 | 4/2015 |

\* cited by examiner

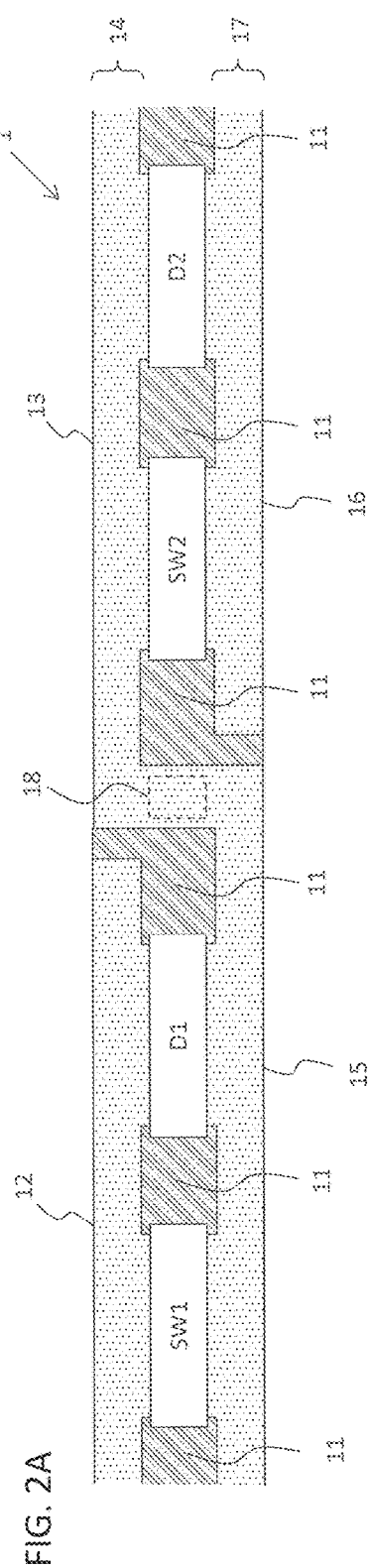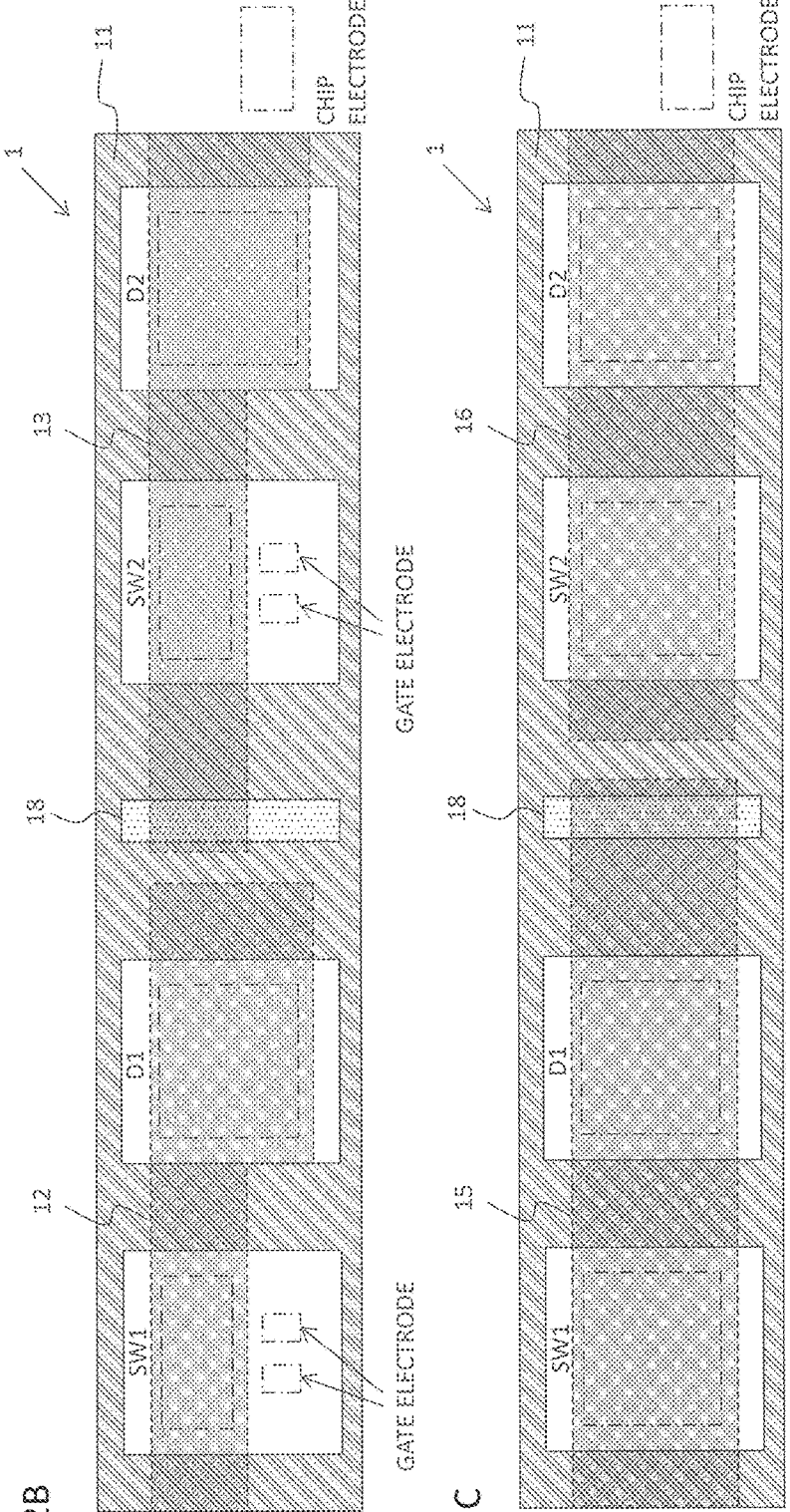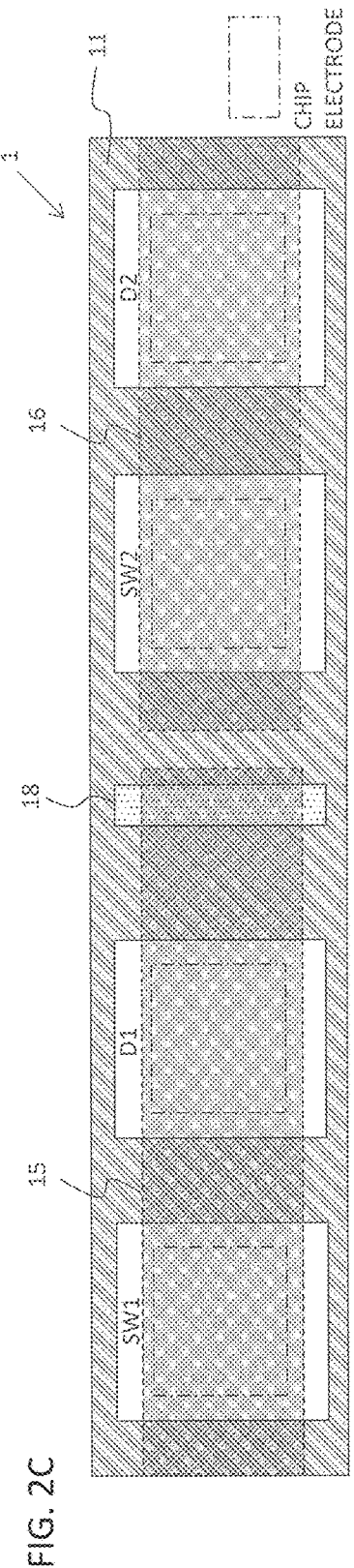
FIG. 2A
FIG. 2B
FIG. 2C (B)

POWER SEMICONDUCTOR MODULE DEVICE

CROSS REFERENCE TO RELATED APPLICATIONS

This application is a continuation of International Patent Application No. PCT/JP2018/019354, filed on May 18, 2018, now pending, the contents of which, including the specification, the claims, and the drawings, are incorporated herein by reference in their entirety. International Patent Application No. PCT/JP2018/019354 is entitled to the benefit of Japanese Patent Application No. 2017-099869, filed on May 19, 2017, the contents of which, including the specification, the claims, and the drawings, are incorporated herein by reference in their entirety.

BACKGROUND ART

Technical Field

The present invention relates to a power semiconductor module device and the like in which a wiring is formed by thick-film plating on at least one of a front surface side and a rear surface side of semiconductor elements arranged via an insulating material.

Wire bonding or solder connection has been conventionally used to connect a semiconductor element electrode and an external terminal. However, in the wire bonding, a wiring length becomes longer, and there is a concern about damage on the semiconductor element due to stress loading by ultrasonic joining. Further, in the case of solder connection, it is difficult to ensure reliability of operation of the semiconductor element at high temperature.

It is thus considered effective to connect the semiconductor element electrode and the external terminal by plating connection. In this plating connection, however, there is a possibility that voids are generated in the connected portions and quality is deteriorated. JP 2007-335473 A1 (hereinafter referred to as "Patent Literature 1") and WO 2015/053356 A1 (hereinafter referred to as "Patent Literature 2"), for example, disclose a technique for preventing generation of voids in the plating connection.

Patent Literature 1 discloses a technique having a configuration in which a plating 4 grows radially around a protrusion 3 between a semiconductor element 1 and a metal plate 2. Patent Literature 2 discloses a technique that at least some of a plurality of electrodes, of an electric circuit, to be electrically connected with each other is directly or indirectly brought into contact and is connected by plating between the electrodes in a state where a plating solution is circulated around the contact portion.

Further, Fan Out wafer Level Package (FOWLP) technology is known as a technique for embedding a semiconductor element or the like with a mold resin for reconstruction. See JP 2014-179429 A1 (hereinafter referred to as "Patent Literature 3"), for example.

The techniques disclosed in Patent Literatures 1 and 2 can suppress generation of voids in the plating connection, but they are not a technique of arranging individual semiconductor elements and joining the respective electrodes by plating. With regard to the FOWLP technology, it has a multilayer structure to connect with an external terminal, in which individual components arranged on a plane are connected to each other by a thick-film single layer, but it does not support a semiconductor.

SUMMARY OF INVENTION

The present invention provides a power semiconductor module device and a power semiconductor module manufacturing method in which semiconductor elements arranged at intervals on a plane are supported by an insulator, and the semiconductor elements are electrically connected to each other from at least one of a front surface side and a rear surface side by a thick-film plating, which simultaneously supports the semiconductor elements from at least one of an upper direction and a lower direction.

A power semiconductor module device according to the present invention includes: a plurality of semiconductor elements that are arranged at intervals and flush with each other on a plane; an insulating support that fixes the semiconductor elements; a first thick-film plating layer that is formed as a first-surface-side electrode that electrically connects the semiconductor elements to each other on at least one surface of a front surface side and a rear surface side, wherein the first thick-film plating layer supports the semiconductor elements from at least one of an upper direction and a lower direction.

As described above, in the power semiconductor module device according to the present invention, a plurality of semiconductor elements arranged at intervals and flush with each other on a plane are fixed by an insulating support, and a first thick-film plating layer is formed as a first-surface-side electrode that electrically connects the semiconductor elements to each other on at least one surface of a front surface side and a rear surface side, and the first thick-film plating layer supports the semiconductor elements from at least one of an upper direction and a lower direction, so that it is possible to form a mechanical supporting structure of the semiconductor elements by plating, thereby resulting in an advantageous effect that it is possible to provide a semiconductor module with a simple structure.

The power semiconductor module device according to the present invention further includes a conductive wiring metal plate that is provided on a surface opposite to the first-surface-side electrode and has a connection surface connected by plating to an electrode of each semiconductor element via an edge, wherein the first thick-film plated layer and the conductive wiring metal plate support the semiconductor elements from the upper and lower directions.

As described above, in the power semiconductor module device according to the present invention, it is further provided with a conductive wiring metal plate that is provided on a surface opposite to the first-surface-side electrode and has a connection surface connected to an electrode of each semiconductor element via an edge, and the first thick-film plated layer and the conductive wiring metal plate support the semiconductor elements from the upper and lower directions, so that the conductive wiring metal plate makes it possible for wiring to be carried out by a simple process in such a case as where patterning is needed only on one surface. In addition, since the electrode of each semiconductor element and the connection surface of the conductive wiring metal plate are mediated by the edge, it is possible to sufficiently circulate a plating solution between the electrode of each semiconductor element and the connection surface of the conductive wiring metal plate and, therefore, it is possible to realize a high-quality plating connection without generating voids or the like.

The edge as mentioned above means a protrusion whose interface between an electrode surface and a joined body to be connected by plating is formed in the shape of a chevron, a cone, a ball, or a cylinder and that has a vertex of a linear or point-like shape, or a spherical or circular shape. By making the plating connection between the electrode surface and a gap around an edge portion via the edge, it is possible to form a robust transfer joining portion with less heat and current loss.

The power semiconductor module device according to the present invention further includes a second thick-film plating layer that is provided on a surface opposite to the first-surface-side electrode and is formed as a second-surface-side electrode that electrically connects the semiconductor elements to each other, and the first thick-film plating layer and the second thick-film plating layer support the semiconductor elements from the upper and lower directions.

As described above, in the power semiconductor module device according to the present invention, it is further provided with a second thick-film plating layer that is provided on a surface opposite to the first-surface-side electrode and is formed as a second-surface-side electrode that electrically connects the semiconductor elements to each other, and the first thick-film plating layer and the second thick-film plating layer support the semiconductor elements from the upper and lower directions, so that it is possible to form a mechanical supporting structure of the semiconductor elements by plating, thereby resulting in an advantageous effect that it is possible to provide a semiconductor module with a simple structure. Further, it results in an advantageous effect that it is possible to easily form the first-surface-side electrode and the second-surface-side electrode by the same plating process.

The power semiconductor module device according to the present invention is such that the first thick-film plating layer and the second thick-film plating layer are substantially the same in thickness, a projected area of a front-surface-side electrode of the first thick-film plating layer is 30% or more of a projected area of the semiconductor elements, a projected area of a rear-surface-side electrode of the second thick-film plating layer is 50% or more of the projected area of the semiconductor elements, and a difference between the projected area of the front-surface-side electrode and the projected area of the rear-surface-side electrode is within 50%.

As described above, in the power semiconductor module device according to the present invention, the first thick-film plating layer and the second thick-film plating layer are substantially the same in thickness, a projected area of a front-surface-side electrode of the first thick-film plating layer is 30% or more of a projected area of the semiconductor elements, a projected area of a rear-surface-side electrode of the second thick-film plating layer is 50% or more of the projected area of the semiconductor elements, and a difference between the projected area of the front-surface-side electrode and the projected area of the rear-surface-side electrode is within 50%, so that it results in advantageous effects that it is possible to improve heat radiation effect with the electrodes on the front surface side and the rear surface side and that it is also possible to keep the difference in effects of thermal expansion on the front surface side and the rear surface side to a minimum and maintain high quality.

The power semiconductor module device according to the present invention is such that a plating thickness of the first thick-film plating layer and the second thick-film plating layer is at least 50 μm or more.

As described above, in the power semiconductor module device according to the present invention, a plating thickness of the first thick-film plating layer and the second thick-film plating layer is at least 50 μm or more, so that it results in advantageous effects that it is possible to firmly support the semiconductor elements while supplying large current to the power semiconductor module. Further, it is desirable to perform heat treatment at a temperature of 150° C. or more after the thick-film wiring is formed. In this case, if the plating thickness is thinner than 50 μm, an amount of warpage increases due to thermal stress caused by a difference in thermal expansion between the thick-film plating layers and the semiconductor elements. By setting the plating thickness to 50 μm or more, it is possible to maintain the shape as a structural material. In addition, the thickness of the plating may be more preferably 100 μm or more, and even more preferably 200 μm or more.

The power semiconductor module device according to the present invention is such that a surface of the first thick-film plating layer and/or the second thick-film plating layer is partially or wholly coated with nickel or a nickel alloy having a thickness of 1 μm or more.

As described above, in the power semiconductor module device according to the present invention, a surface of the first thick-film plating layer and/or the second thick-film plating layer is partially or wholly coated with nickel or a nickel alloy having a thickness of 1 μm or more, so that it results in an advantageous effect that it is possible to obtain a wiring structure having excellent conductivity and excellent corrosion resistance at a high temperature.

The power semiconductor module device according to the present invention is such that one of the plurality of semiconductor elements is a switching element, at least one of the semiconductor elements other than the switching element is a diode, a conductor that is provided for electrically connecting the first-surface-side electrode and the second-surface-side electrode and has substantially the same thickness as that of the semiconductor elements is disposed between the semiconductor elements, and the conductor is electrically connected to the first-surface-side electrode and the second-surface-side electrode.

As described above, in the power semiconductor module device according to the present invention, one of the plurality of semiconductor elements is a switching element, at least one of the semiconductor elements other than the switching element is a diode, a conductor that is provided for electrically connecting the first-surface-side electrode and the second-surface-side electrode and has substantially the same thickness as that of the semiconductor elements is disposed between the semiconductor elements, and the conductor is electrically connected to the first-surface-side electrode and the second-surface-side electrode, so that it results in advantageous effects that it is possible to realize a high-performance switching element with such a simple structure as described above and that it is also possible to electrically and reliably connect the first-surface-side electrode and the second-surface-side electrode by the plating connection via the conductor.

The power semiconductor module device according to the present invention is such that a heat spreader for diffusing heat is formed on a surface of the conductive wiring metal plate by plating.

As described above, in the power semiconductor module device according to the present invention, a heat spreader for diffusing heat is formed on a surface of the conductive wiring metal plate by plating, so that it results in an advantageous effect that it is possible to efficiently dissipate heat. Further, since the heat spreader is formed by plating, it results in an advantageous effect that it is possible to efficiently transfer heat of the conductive wiring metal plate to the heat spreader, without solder or the like between the conductive wiring metal plate and the heat spreader.

BRIEF DESCRIPTION OF DRAWINGS

FIGS. 2A to 2C are diagrams showing a configuration of the power semiconductor module device according to the first embodiment, where FIG. 2A is a sectional side view, FIG. 2B is a top projection view, and FIG. 2C is a bottom projection view.

FIG. 8A is a top view and FIG. 8B is a cross-sectional view taken along the line a-a of FIG. 8A.

FIG. 9A is a top view and FIG. 9B is a cross-sectional view taken along the line a-a of FIG. 9A.

FIG. 11A is a top view, FIG. 11B is a bottom view, and FIG. 11C is a cross-sectional view taken along the line a-a of FIG. 11A.

FIG. 12A is a top view, FIG. 12B is a bottom view, and FIG. 12C is a cross-sectional view taken along the line a-a of FIG. 12A.

DESCRIPTION OF EMBODIMENTS

Figure 1:
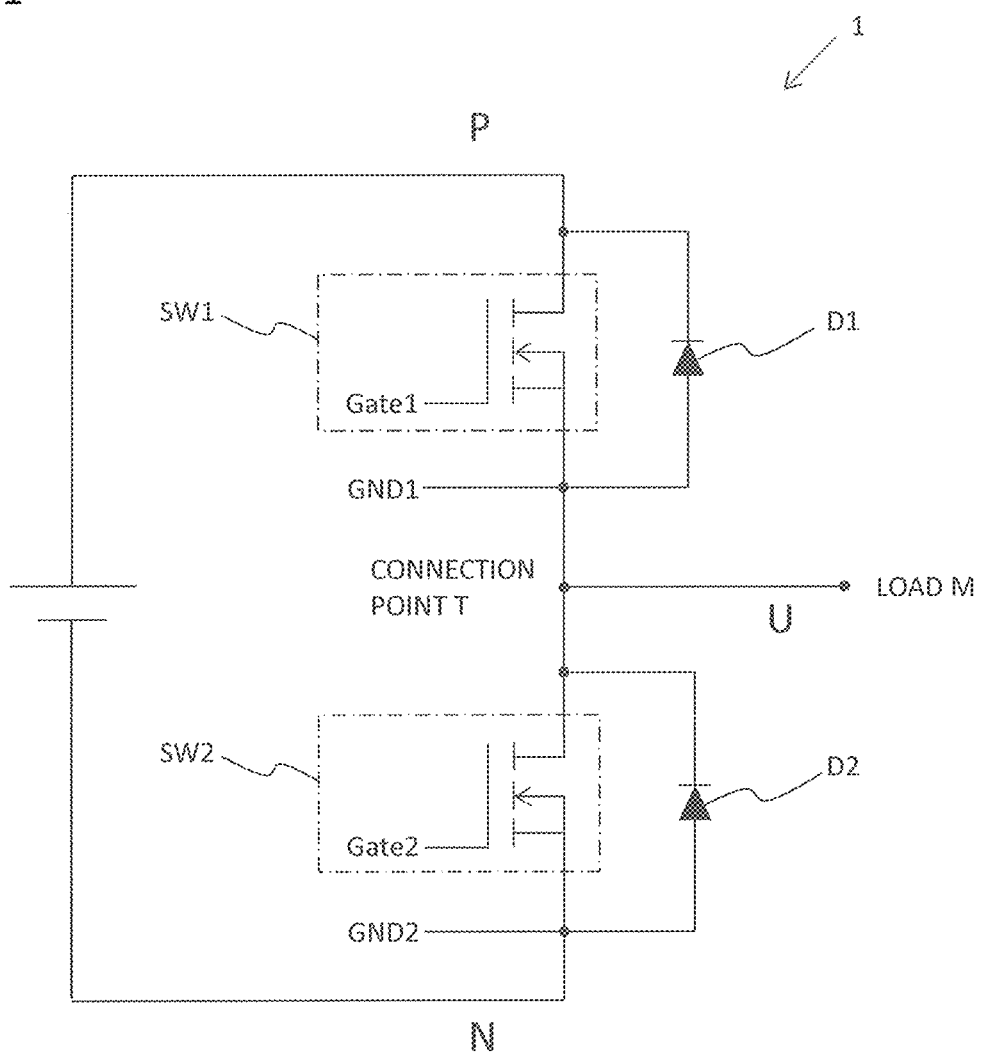
FIG. 1 is a diagram showing an example of a circuit diagram of a power semiconductor module device according to a first embodiment.

Hereinafter, embodiments of the present invention will be described. The same reference numerals are given to the same elements throughout the entire embodiments.

First Embodiment

A power semiconductor module device according to the present embodiment will be described with reference to FIGS. 1A to 7G. The power semiconductor module device according to the present embodiment has a configuration in which: an insulating support fixes a plurality of semiconductor elements that are arranged at intervals and flush with each other on a plane; a first thick-film plating layer is formed as a first-surface-side electrode (hereinafter referred to as a "front-surface-side electrode") that electrically connects the semiconductor elements to each other on a first surface side (hereinafter referred to as a "front surface side"); and a second thick-film plating layer is formed as a second-surface-side electrode (hereinafter referred to as a "rear-surface-side electrode") that electrically connects the semiconductor elements to each other on a second surface side (hereinafter referred to as a "rear surface side"), thereby also forming the first thick-film plating layer and the second thick-film plating layer as a support that supports the semiconductor elements from upper and lower directions.

In the power semiconductor module device according to the present embodiment, a switching power supply circuit in which the first semiconductor element comprises a high-side switching element SW1, the second semiconductor element comprises a diode D1 corresponding to the switching element SW1, the third semiconductor element comprises a low-side switching element SW2, and the fourth semiconductor element comprises a diode D2 corresponding to the switching element SW2, for example, will be described. Note that the technique according to the present embodiment may also be applied to power semiconductors other than the switching power supply circuit. Further, elements made of material such as silicon (Si) or silicon carbide (SiC) may be used as switching elements, and combinations such as a SiC metal oxide semiconductor (SiC MOS) and a diode, and an insulated gate bipolar transistor (IGBT) and a diode may be used.

FIG. 1 is a diagram showing an example of a circuit diagram of a power semiconductor module device according to the present embodiment. In FIG. 1, a switching power supply circuit 1 converts a direct current into an alternating current and supplies the alternating current to a load. The direct current supplied to the switching power supply circuit 1 is converted into the alternating current by complementary switching of the switching elements. The high-side switching element SW1 and the low-side switching element SW2 are connected in series, and electric power is supplied from a connection point T thereof to a load M such as a motor, for example. The diodes D1 and D2 are connected to the switching elements SW1 and SW2, respectively, in reversely parallel to the respective switching elements SW1 and SW2 so that the switching elements SW1 and SW2 are not destroyed by counter electromotive force.

Note that in the power semiconductor module device according to the present embodiment, it is possible to manufacture individual modules by collectively forming a plurality of modules at a substrate level and finally dividing it into each module unit. Details of the manufacturing method will be described later.

FIG. 2 is a diagram showing a configuration of the power semiconductor module device according to the present embodiment. FIG. 2A is a sectional side view, FIG. 2B is a top projection view, and FIG. 2C is a bottom projection view. The switching power supply circuit 1 constituting the power semiconductor module device includes: semiconductor elements of the switching element SW1, the diode D1, the switching element SW2, and the diode D2, which are arranged flush with each other on a plane; an insulating support 11 that is filled between the semiconductor elements and supports the semiconductor elements from at least a side direction; a first thick-film plating layer 14 that is formed as a first front-surface-side electrode 12 and a second front-surface-side electrode 13, the first front-surface-side electrode 12 electrically connecting the front surface sides of the switching element SW1 and the diode D1, the second front-surface-side electrode 13 electrically connecting the front surface sides of the switching element SW2 and the diode D2; a second thick-film plating layer 17 that is formed as a first rear-surface-side electrode 15 and a second rear-surface-side electrode 16, the first rear-surface-side electrode 15 electrically connecting the rear surface sides of the switching element SW1 and the diode D1, the second rear-surface-side electrode 16 electrically connecting the rear surface sides of the switching element SW2 and the diode D2; and a conductor 18 for electrically connecting the first rear-surface-side electrode 15 and the second front-surface-side electrode 13 to each other via a plating layer.

As shown in FIG. 2A, the respective semiconductor elements arranged flush with each other on the plane are structured to be supported from the side direction by the insulating support 11 interposed between the semiconductor elements and to be more firmly supported by the first thick-film plating layer 14 and the second thick-film plating layer 17 from upper and lower directions. The first thick-film plating layer 14 and the second thick-film plating layer 17 have a thickness of at least 50 µm (more preferably 100 µm, even more preferably 200 µm) or more, which enables electrical connection between the semiconductor elements and with the outside and firmly supporting and fixing the respective semiconductor elements. That is, the first thick-film plating layer 14 and the second thick-film plating layer 17 are enabled to function as a wiring metal substrate, and the present embodiment has a structure such that a wiring metal substrate as a component is unnecessary. Further, it is desirable to perform heat treatment at a temperature of 150° C. or more after the thick-film plating layers are formed. In this case, if the thick-film plating layers are thinner than 50 µm, an amount of warpage increases due to thermal stress caused by a difference in thermal expansion between the thick-film plating layers and the semiconductor elements. By setting the thickness of the thick-film plating layers to 50 µm or more, it is possible to maintain the shape as a structural material.

As shown in FIGS. 2B and 2C, a projected area of electrode portions (the first front-surface-side electrode 12, the second front-surface-side electrode 13, the first rear-surface-side electrode 15, and the second rear-surface-side electrode 16) of the first thick-film plating layer 14 and the second thick-film plating layer 17 is at least 30% or more of a projected area of the semiconductor elements on the side with gate electrodes, that is, with respect to the first front-surface-side electrode 12 and the second front-surface-side electrode 13, as shown in FIG. 2B, and is at least 50% or more of the projected area of the semiconductor elements on the side without gate electrodes, that is, with respect to the first rear-surface-side electrode 15 and the second rear-surface-side electrode 16, as shown in FIG. 2C. In both cases, it is possible to firmly support the respective semiconductor elements from the upper and lower directions while supplying large current.

Further, as described above, both of the first thick-film plating layer 14 and the second thick-film plating layer 17 have the thickness of 50 µm (more preferably 100 µm, even more preferably 200 µm) or more and are substantially the same in thickness. A difference between the projected area of the first front-surface-side electrode 12 and the second front-surface-side electrode 13 in the first thick-film plating layer 14 and the projected area of the first rear-surface-side electrode 15 and the second rear-surface-side electrode 16 in the second thick-film plating layer 17 (that is, the projected area of the first front-surface-side electrode 12 and the second front-surface-side electrode 13 as shown in FIG. 2B and the projected area of the first rear-surface-side electrode 15 and the second rear-surface-side electrode 16 as shown in FIG. 2C) is within 50%. Thus, a difference in thermal expansion hardly occurs between the first thick-film plating layer 14 and the second thick-film plating layer 17, so that it is possible to prevent the quality from being deteriorated due to deformation stress or the like caused by the thermal expansion. In particular, when laminated in multiple layers, it is possible to keep a deflection between upper and lower sides to a minimum and maintain its quality.

In addition, the first front-surface-side electrode 12 and the second front-surface-side electrode 13 of the first thick-film plating layer 14 and the first rear-surface-side electrode 15, and the second rear-surface-side electrode 16 of the second thick-film plating layer 17 are preferably made of copper, a copper alloy, nickel, a nickel alloy, silver, aluminum, zinc, palladium or the like. Further, at least the outermost surface may be coated with nickel plating to prevent corrosion or the like.

By forming a main plating layer by Cu plating and forming a coating layer with a thickness of 1µm or more on its surface, for example, it is possible to obtain a wiring structure having excellent conductivity and excellent corrosion resistance at high temperature. On an underlying layer for plating, metal such as chromium (Cr), nickel (Ni), titanium (Ti), palladium (Pd) or the like having excellent adhesion to both an insulating material and a semiconductor element electrode, or an alloy thereof, or a multilayer of these metals can be vapor-deposited by sputtering, which can be used as a seed layer to carry out metal plating.

Further, it is preferable to form a Cr, Ni, or Pd film from the electrode side, or to further form a film of the same type as the plating metal on the resultant Cr, Ni, or Pd film from the electrode side, or to form a silver (Ag) or gold (Au) film for preventing oxidation on the outermost surface.

Further, as a method of plating treatment for forming the first thick-film plating layer 14 and the second thick-film plating layer 17, it is possible to use hot-dip plating other than electroplating. Hot-dip plating metal may be Zn, Al or an alloy thereof having a relatively low melting point. In this case, the semiconductor element may be a compound semiconductor element such as gallium nitride (GaN) or silicon carbide (SiC) having excellent heat resistance.

Furthermore, any one or more of the semiconductor elements as mentioned above may be a SiC or GaN semiconductor. By doing so, it is possible to improve heat radiation effect.

Figure 3A:
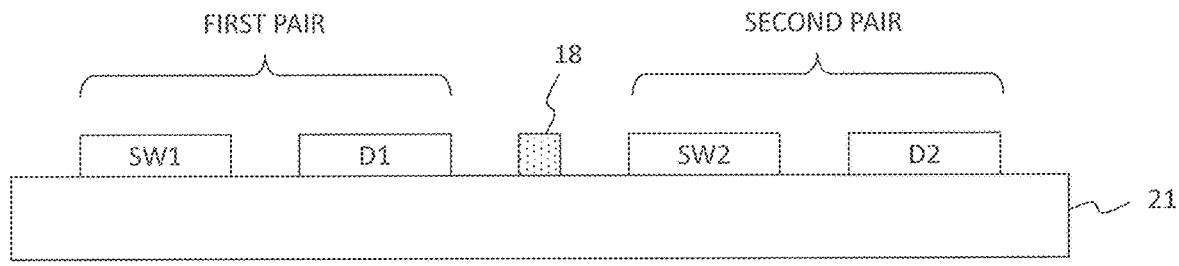
FIGS. 3A to 3C are stepwise cross-sectional views showing a method for manufacturing the power semiconductor module device according to the first embodiment.
Figure 3B:
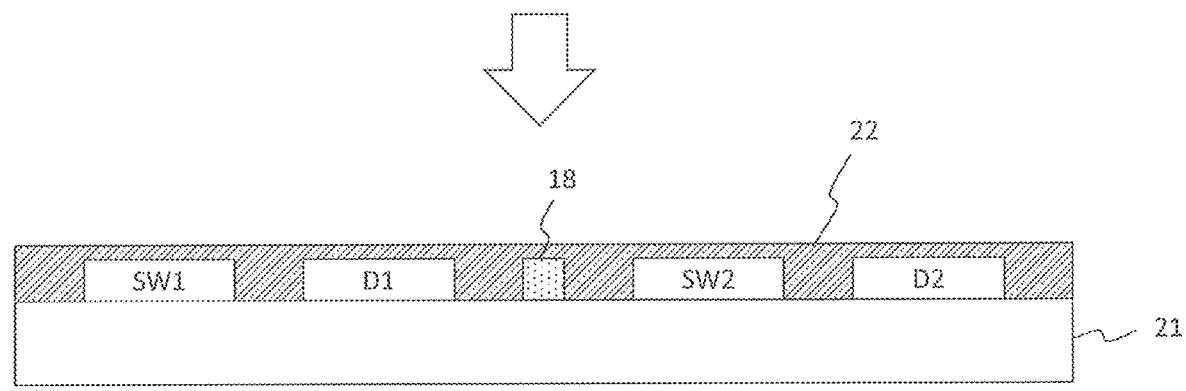
Figure 3C:
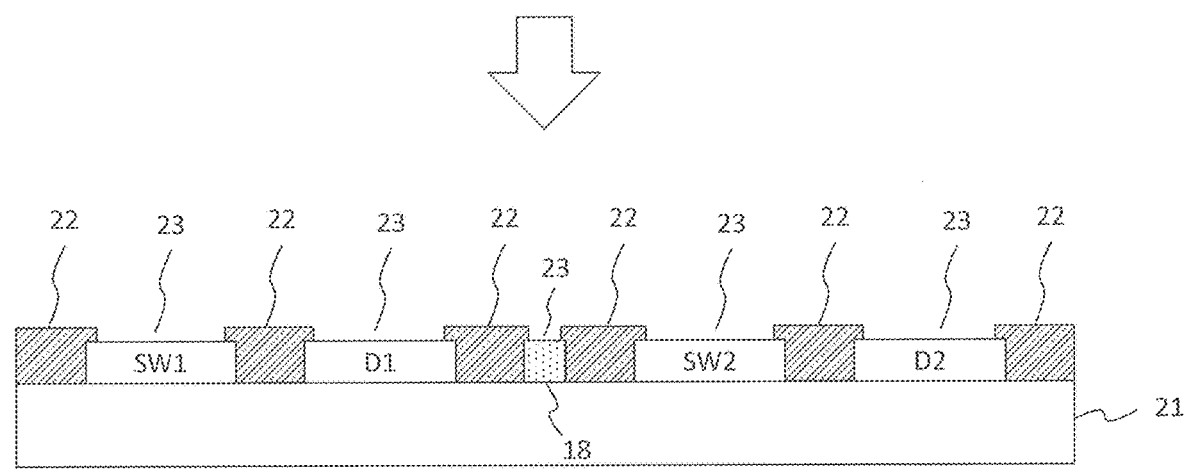

Next, a method for manufacturing the power semiconductor module device according to the present embodiment will be described. First, as shown in FIG. 3A, the semiconductor elements of the switching element SW1, the diode D1, the switching element SW2, and the diode D2 are arranged at intervals with being flush with each other on a substrate 21, and the conductor 18 is disposed between a first pair of the switching element SW1 and the diode D1 and a second pair of the switching element SW2 and the diode D2. After the respective semiconductor elements and the conductor 18 are arranged, a resin 22 is molded to embed the above respective semiconductor elements and the conductor 18, as shown in FIG. 3B. As shown in FIG. 3C, grooves 23 are formed in the molded resin 22 such that the electrode portions of the above respective semiconductor elements and the surface of the conductors 18 are exposed. For this process, it is possible to apply general exposure and etching treatments using a resist. For example, a resist is coated on the resin 22, selective exposure treatment is performed, and subsequently resist removal is performed to form openings in the resist. The openings are subjected to dry etching or chemical treatment to remove the resin 22 at the openings to form the grooves 23, and subsequently the resist is removed. In addition, as an alternative method, it may be possible to, after the process of FIG. 3A, dispose a heat resistant mask at portions to be opened, mold a resin, and then remove the mask together with the resin thereon to form the grooves 23.

Figure 4A:
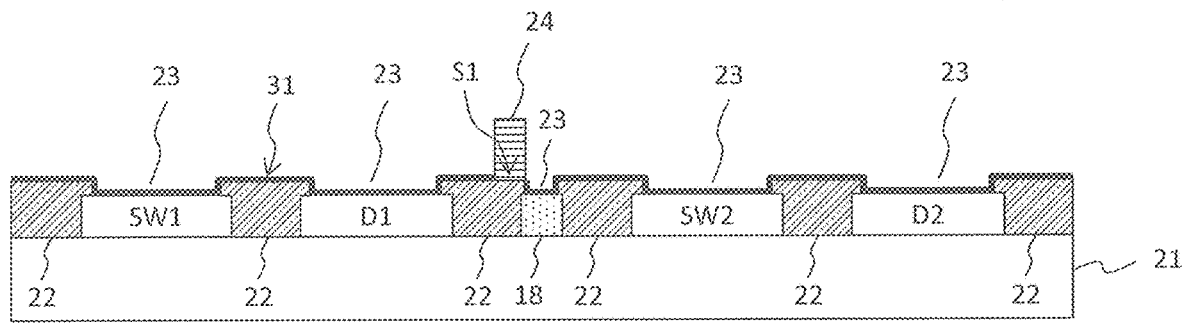
FIGS. 4A to 4C are the next stepwise cross-sectional views showing the method for manufacturing the power semiconductor module device according to the first embodiment.
Figure 4B:
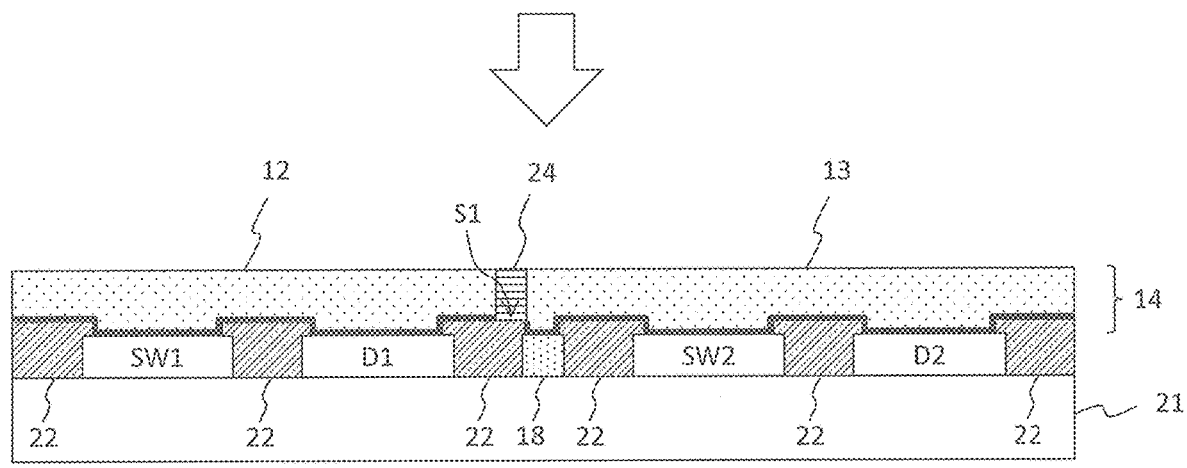
Figure 4C:
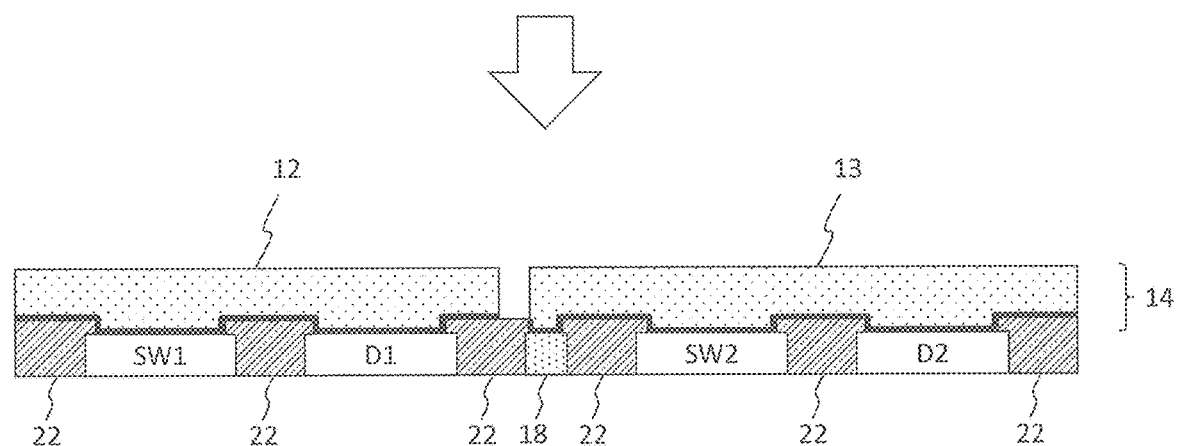

Subsequently, as shown in FIG. 4A, a seed 31 for plating treatment is formed on a surface of FIG. 3C in a state where a region 51 in which no electrode is formed is masked with a mask 24. A resist can be used as the mask 24, and by performing exposure and selective removal as described above, it is possible to leave the resist only on the region 51. After the seed 31 is formed, a plating treatment is performed, while the region 51 is kept to be masked, to form the first thick-film plating layer 14 as the first front-surface-side electrode 12 and the second front-surface-side electrode 13, as shown in FIG. 4B. After the first thick-film plating layer 14 is formed, the resist used as the mask 24 is removed, and subsequently the substrate is separated as shown in FIG. 4C, and then the process proceeds to the rear surface side. In addition, to facilitate the separation of the substrate, a heat-resistant double-sided adhesive sheet which can be peeled off by heating or ultraviolet ray may be used in advance for adhesion between the substrate and the elements.

Figure 5A:
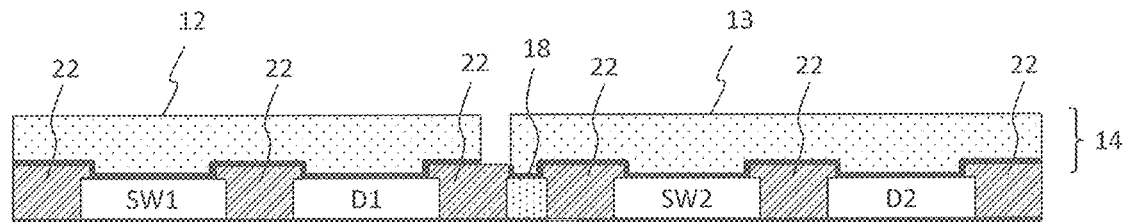
FIGS. 5A to 5C are the next stepwise cross-sectional views showing the method for manufacturing the power semiconductor module device according to the first embodiment.
Figure 5B:
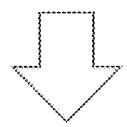
Figure 5B:
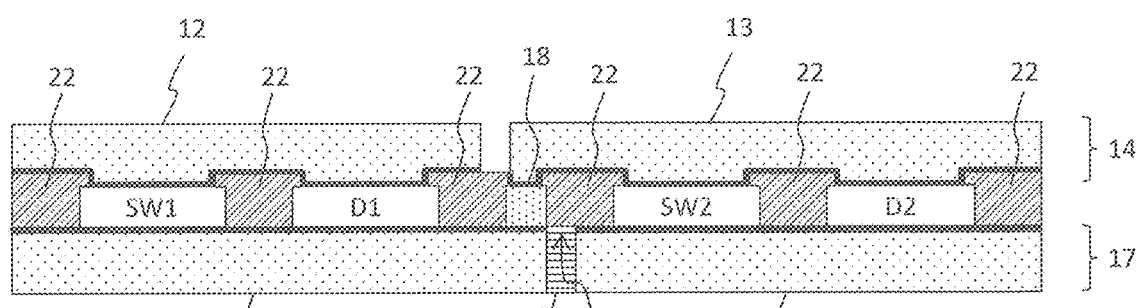
Figure 5C:
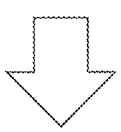
Figure 5C:
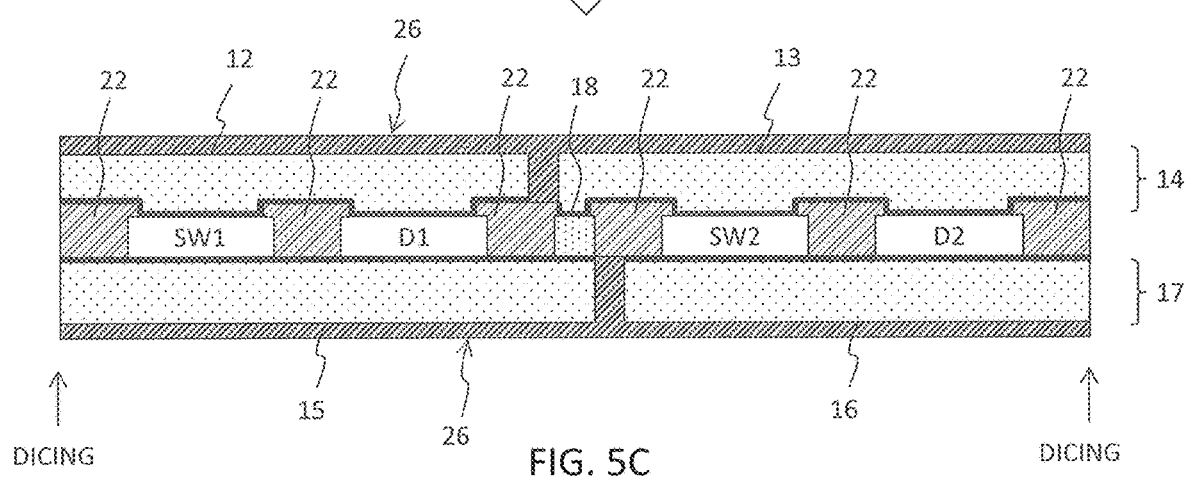

On the rear surface side, as shown in FIG. 5A, a seed 41 for plating treatment is formed on a rear-surface-side surface in a state where a region S2 in which no electrode is formed with a mask 25 as is the case in FIG. 4A. After the seed 41 is formed, a resist treatment is performed, while the region S2 is kept to be masked, such that plating does not intrude into a space below the region S2, and the plating treatment is performed to form the second thick-film plating layer 17 as the first rear-surface-side electrode 15 and the second rear-surface-side electrode 16, as shown in FIG. 5B. After the second thick-film plating layer 17 is formed, the resist used as the mask 25 is removed. Subsequently, the whole is molded with a resin 26 and dicing is performed in a unit of module, as shown in FIG. 5C, thereby resulting in that the power semiconductor module according to the present embodiment is manufactured.

Note that for the above-mentioned plating treatment, any of electrolytic plating, non-electrolytic plating, and hot-dip plating can be applied. Further, an insulator of the resin 22 may be provided by forming a ceramic or P glass by a sol-gel method, for example. Further, a layer of the resin 26 is formed by built-up in the uppermost layer as shown in FIG. 5C, and furthermore a heat radiation substrate or a heat radiation fin may be formed by metal melting (a die casting method).

Figure 6:
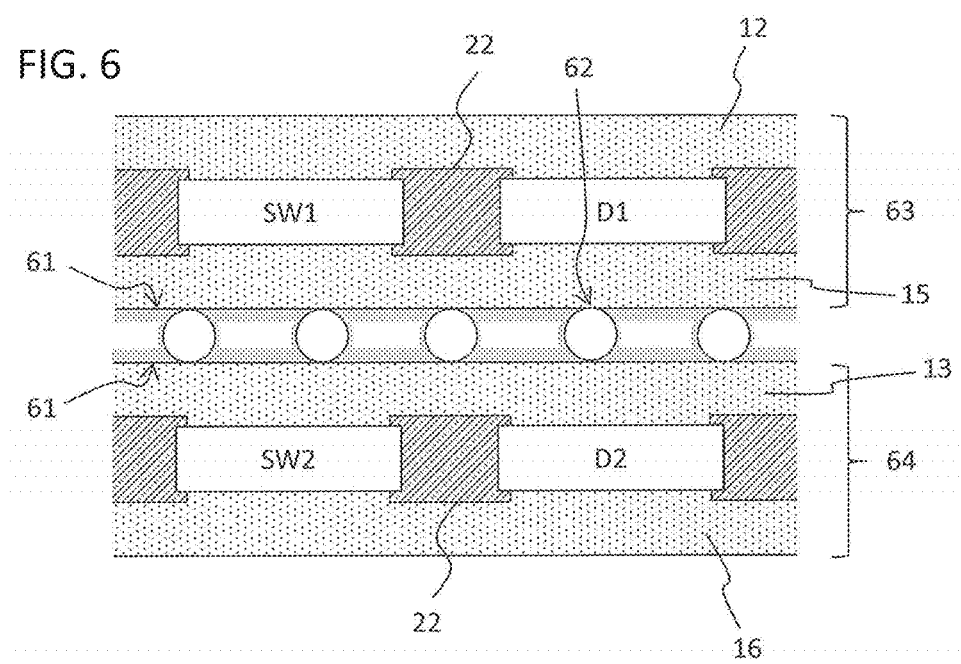
FIG. 6 is a diagram showing another configuration of the power semiconductor module device according to the first embodiment.

Further, in the above manufacturing process, a laminate structure may be formed without arranging the conductor 18, as shown in FIG. 6, by performing dicing so as to divide into a first pair 63 of the switching element SW1 and the diode D1 and a second pair 64 of the switching element SW2 and the diode D2 at the position of the conductor 18, externally connecting or longitudinally laminating the respective components, and connecting them by plating on an adjacent surface 61 via an edge portion 62 such as a wire or a ball, thereby resulting in that the respective semiconductor elements (the switching element SW1, the diode D1, the switching element SW2, and the diode D2) divided into the first pair 63 and the second pair 64 are electrically connected. In this case, a plating technique as disclosed in Patent Literature 1 can be used, for example.

As described above, in the power semiconductor module device according to the present embodiment, the insulating support fixes the plurality of semiconductor elements that are arranged at intervals and flush with each other on the plane, the semiconductor elements are electrically connected to each other on the front surface side and the rear surface side, the first thick-film plating layer and the second thick-film plating layer are provided on the respective surface sides, and the first thick-film plating layer and the second thick-film plating layer support the semiconductor elements from the upper and lower directions, so that it is possible to form a mechanical supporting structure of the semiconductor elements by plating, thereby resulting in that it is possible to provide the semiconductor module with the simple structure.

Second Embodiment

A method for manufacturing a power semiconductor module device according to the present embodiment will be described with reference to FIGS. 7A to 7G. It is possible to manufacture the power semiconductor module device using the manufacturing method as shown in FIGS. 7A to 7G, other than the method for manufacturing the power semiconductor module device as shown in FIGS. 3A to 5C in the above first embodiment. In the present embodiment, description overlapping with the first embodiment will be omitted.

Figure 7A:
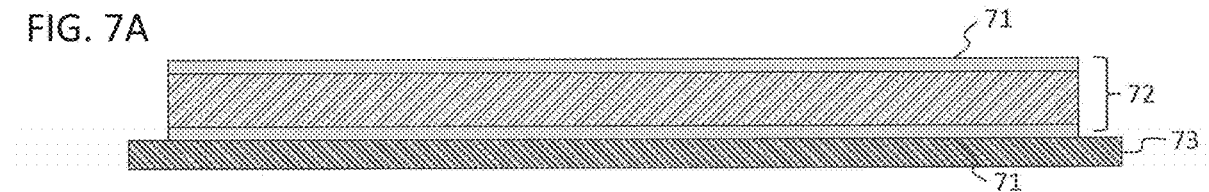
FIGS. 7A to 7G are stepwise cross-sectional views showing a method for manufacturing a power semiconductor module device according to a second embodiment.
Figure 7B:
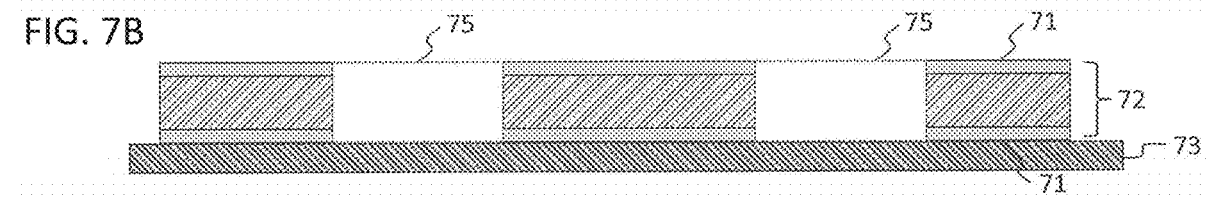
Figure 7C:
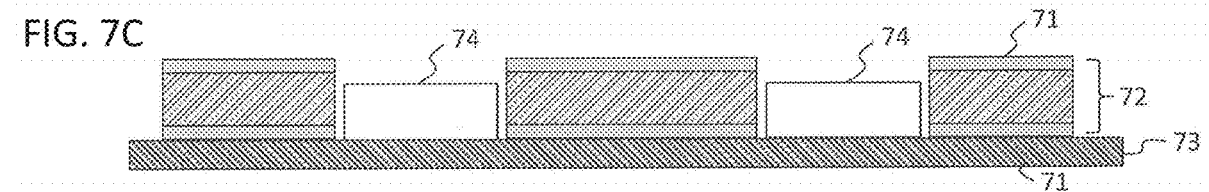
Figure 7D:
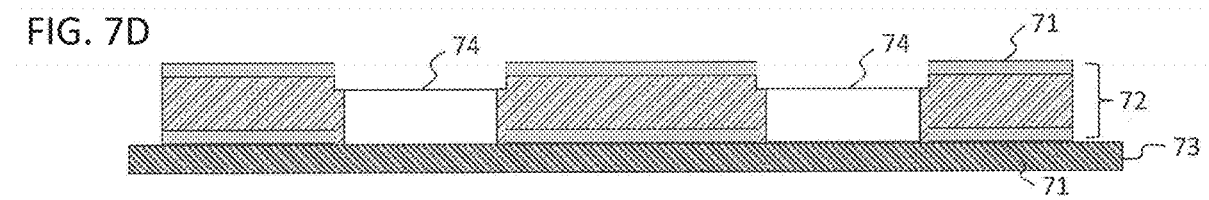
Figure 7E:
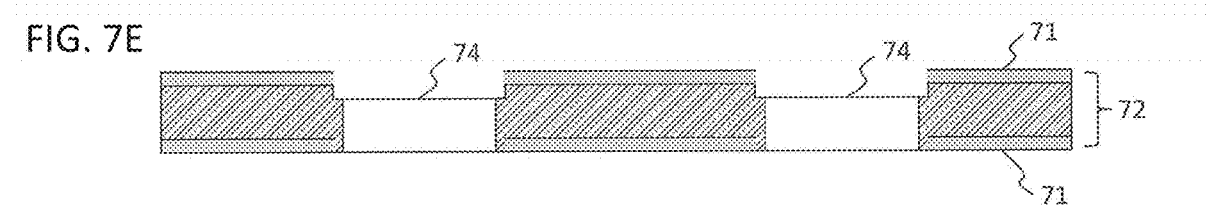
Figure 7F:
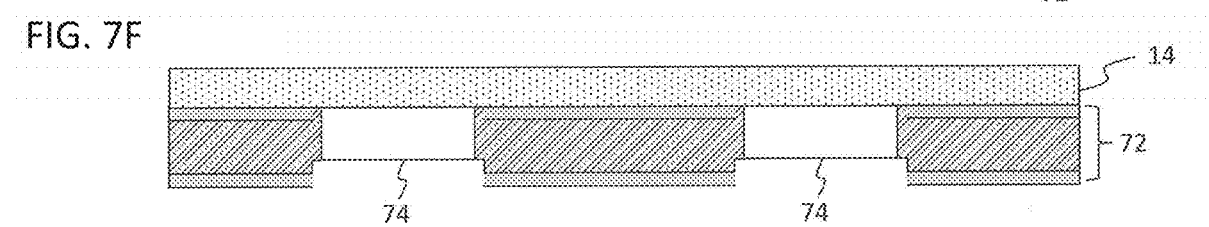
Figure 7G:
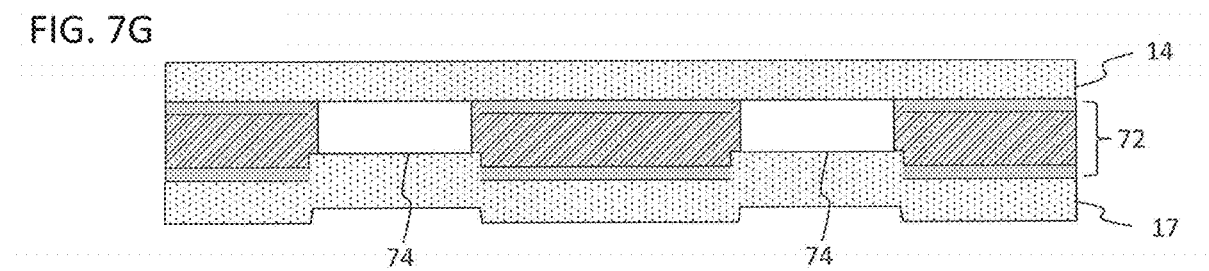

Specifically, a ceramic or resin substrate (substrate 72) on which a conductive wiring metal plate 71 having conductivity (for example, Cu or the like) is formed on both the front surface side and the rear surface side is prepared, and a surface to be the front surface side is temporarily fixed with a temporary fixing tape 73 for support (FIG. 7A). Through holes 75 larger than the semiconductor elements 74 are formed on the substrate 72 of FIG. 7A (FIG. 7B) and the semiconductor elements 74 are arranged in the through holes (FIG. 7C). An insulating resin or a ceramic particle paste or the like is filled between the substrate 72 and the semiconductor elements 74 by a dispenser, for example (FIG. 7D). After the filled insulating resin or ceramic particle paste is cured, the temporary fixing tape 73 is peeled off (FIG. 7E). The front surface side is masked with a metal mask or a mask tape, for example, in accordance with a wiring pattern to form a seed layer and deposit a thick-film plating metal, thereby resulting in that a wiring is formed with the first thick-film plating layer 14 (FIG. 7F). In the same way, a thick-film plating metal is deposited on the rear surface side to form a wiring with the second thick-film plating layer 17 (FIG. 7G). By using such a manufacturing method, it is possible to form a structure similar to the structure as shown in FIGS. 2A to 2C.

In addition, the resin substrate may be a polyimide material with a conductive wiring metal plate adhered on both sides thereof, for example. The thickness of the insulating material is preferably 50 µm to 1 mm, and the thickness of the copper plate is preferably about 50 µm to 0.5 mm.

Third Embodiment

A power semiconductor module device according to the present embodiment will be described with reference to FIGS. 8A to 11C. In the power semiconductor module device according to the present embodiment, an electrode of either one of the front surface side and the rear surface side is formed with the thick-film plating described in each of the above embodiments, and an electrode on the other surface side is formed with a conductive wiring metal plate. In this case, bond pad surface of electrodes of the conductive wiring metal plate and the semiconductor elements is connected by plating via an edge portion. In the present embodiment, an electrode on a surface which requires patterning is formed with the conductive wiring metal plate and an electrode on a surface which does not require patterning is formed with the thick-film plating, for example. In the present embodiment, description overlapping each of the above-described embodiments will be omitted.

Figure 8A:
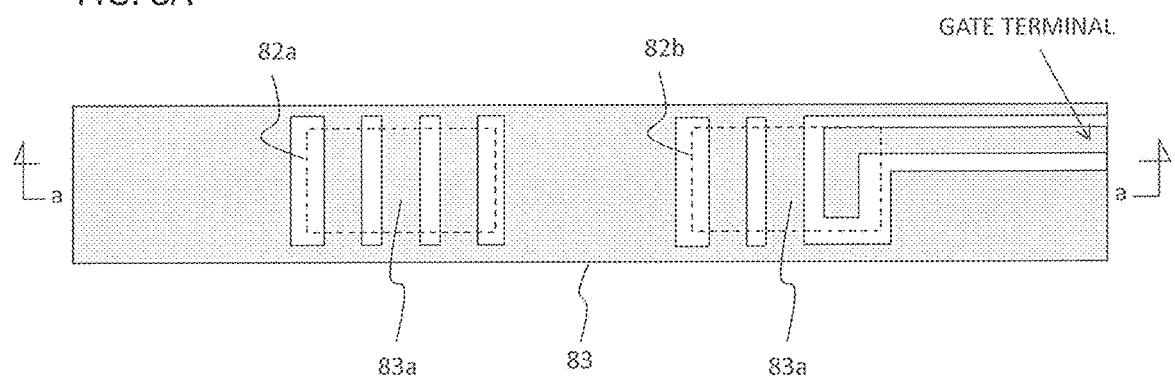
FIGS. 8A and 8B are diagrams showing a first example of a configuration of a power semiconductor module device according to a third embodiment, where
Figure 8B:
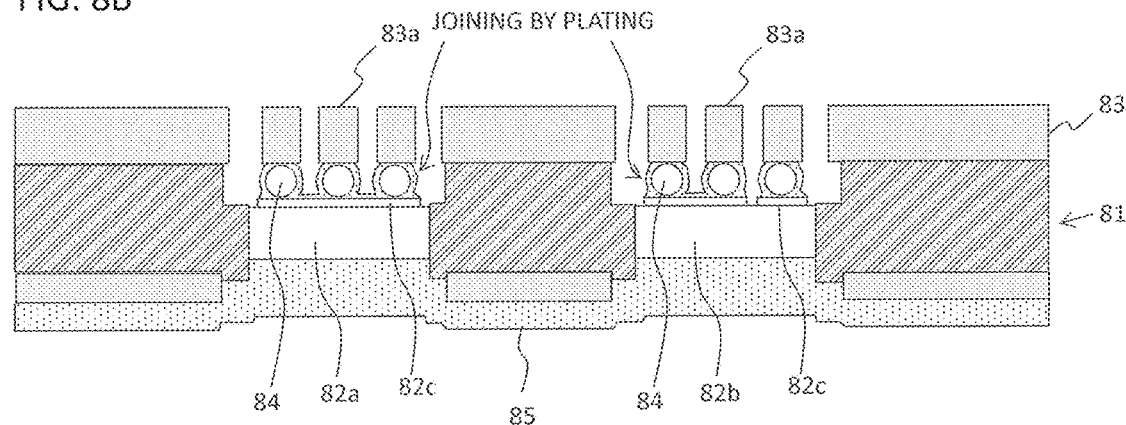

FIGS. 8A and 8B are diagrams showing a first example of a configuration of a power semiconductor module device according to the present embodiment. Note that FIGS. 8A and 8B and FIGS. 9A and 9B show a structure in which a diode and a metal-oxide semiconductor field-effect transistor (MOSFET) are used as an example. FIG. 8A is a top view and FIG. 8B is a cross-sectional view taken along the line a-a of FIG. 8A. In FIGS. 8A and 8B, semiconductor elements 82 (in this case, a diode 82a and a MOSFET 82b) are embedded in a ceramic substrate 81 on both sides of which the conductive wiring metal plate is arranged, and a ceramic material is filled in gaps at the sides of the respective semiconductor elements 82 to support the semiconductor elements 82 from a side direction thereof. On the front surface side, leads 83a of the conductive wiring metal plate 83 and electrodes 82c of the semiconductor elements 82 are connected by plating via edge portions of bumps 84. Since there is a gap between the leads 83a as shown in FIG. 8B, it is possible to sufficiently circulate a plating solution between the electrodes 82c of the semiconductor elements 82 and the connection surfaces of the leads 83a, so that plating connection via edge portions makes it possible to realize a high-quality plating connection without generating voids or the like. The rear surface side has a structure in which a thick-film plating layer 85 is formed as a wiring, as described in the above first embodiment.

Figure 9A:
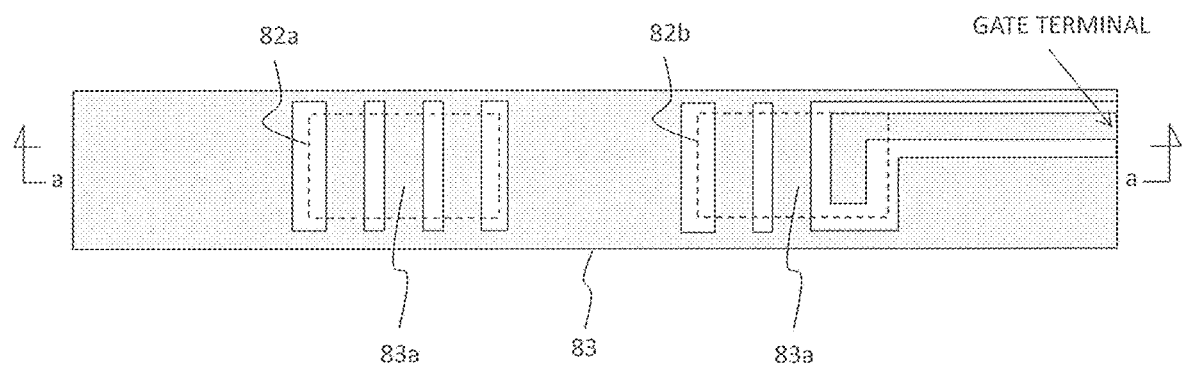
FIGS. 9A and 9B are diagrams showing a second example of the configuration of the power semiconductor module device according to the third embodiment, where
Figure 9B:
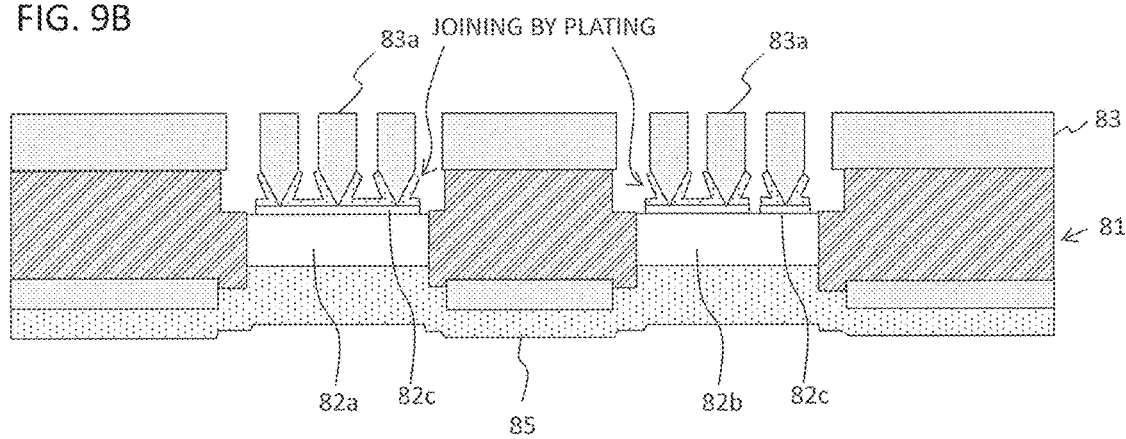

In FIGS. 9A and 9B, FIG. 9A is a top view and FIG. 9B is a cross-sectional view taken along the line a-a of FIG. 9A. As is the case in FIGS. 8A and 8B, the semiconductor elements 82 are embedded in the ceramic substrate 81 on both sides of which the conductive wiring metal plate is arranged, and the ceramic material is filled in gaps at the sides of the respective semiconductor elements 82 to support the semiconductor elements 82 from the side direction thereof. On the front surface side, connection surfaces of the leads 83a of the conductive wiring metal plate 83 are formed in a chevron shape and are connected to the electrodes 82c of the semiconductor elements 82 by plating via edge portions having such a chevron shape. Here also, since there is a gap between the leads 83a as shown in FIG. 9B, it is possible to sufficiently circulate a plating solution between the electrodes 82c of the semiconductor elements 82 and the connection surfaces of the leads 83a, so that plating connection via edge portions makes it possible to realize a high-quality plating connection without generating voids or the like. The rear surface side has the structure in which the thick-film plating layer 85 is formed as a wiring, as described in the above first embodiment.

Figure 10A:
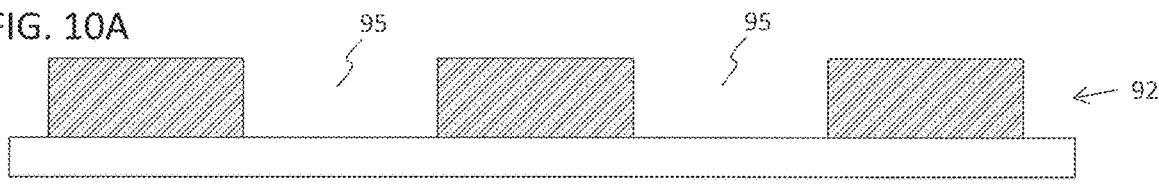
FIGS. 10A to 10F are stepwise cross-sectional views showing a method for manufacturing the power semiconductor module device according to the third embodiment.
Figure 10B:
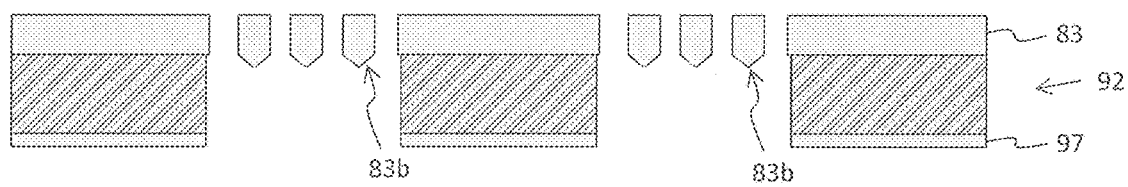

Next, a method for manufacturing the power semiconductor module device according to the present embodiment will be described. Here, the structure of FIGS. 9A and 9B will be described. FIGS. 10A to 10F are stepwise cross-sectional views showing a manufacturing process of the power semiconductor module device according to the present embodiment. First, a ceramic or resin substrate (substrate 92) is prepared, and through holes 95 larger than the semiconductor elements 82 (in this case, the diode 82a and the MOSFET 82b) are formed (FIG. 10A). The conductive wiring metal plate 83 is adhered to the front surface side and the rear surface side of the substrate 92 (FIG. 10B). At this time, the conductive wiring metal plate 83 on the front surface side is adhered to at least a region other than the through holes 95, and a plurality of leads 83a are disposed at intervals in a region of the through holes 95. These leads 83a are adhered such that the position of a surface electrode of the respective semiconductor elements 82 to be embedded in the through holes 95 in the process which will be described later corresponds to the position of the respective chevron-shaped edge portions 83b formed on the leads 83a. The conductive wiring metal plate 83 on the rear surface side is adhered to the region other than the through holes 95, and the region of the through holes 95 is in an opened state.

Figure 10C:
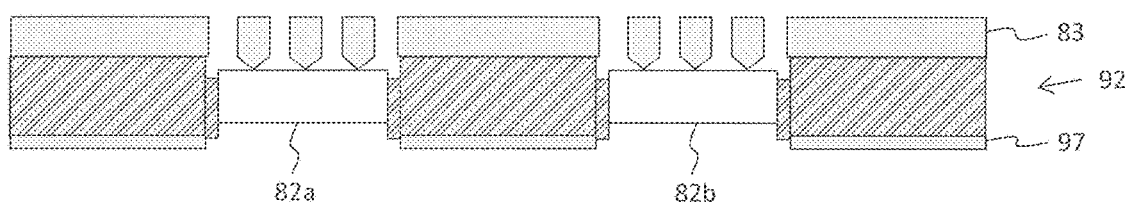
Figure 10D:
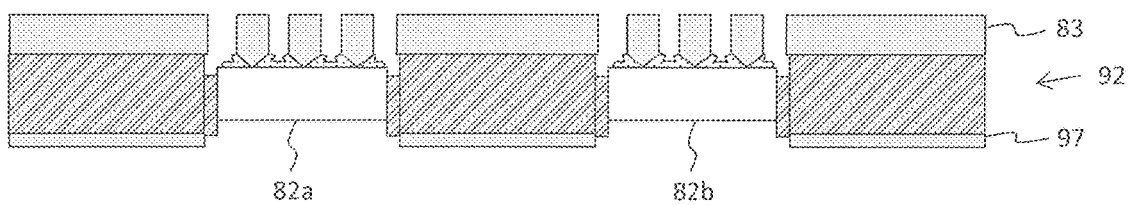
Figure 10E:
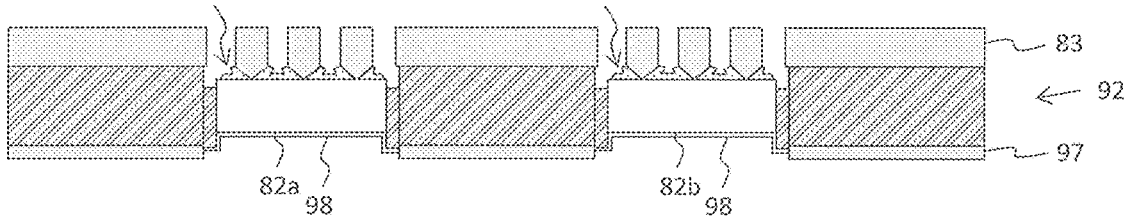
Figure 10F:
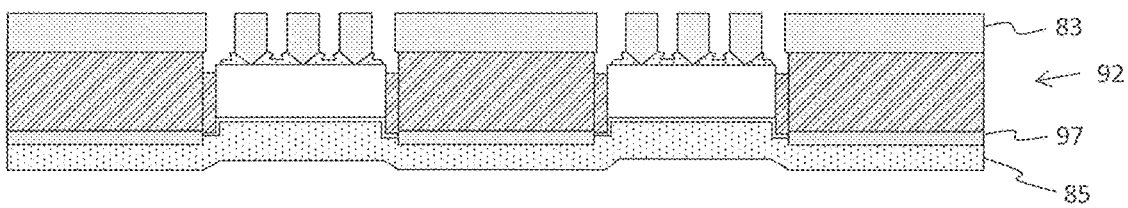

The semiconductor elements 82 are fitted into the through holes 95 from the openings on the rear surface side, and an insulating resin or a ceramic particle paste or the like is filled between the substrate 92 and the semiconductor elements 82 by a dispenser to fix them, for example (FIG. 10C). The edge portions 83b of the leads 83a are plated to connect the conductive wiring metal plate 83 on the front surface side and the semiconductor elements 82 (FIG. 10D). A copper thin film 98 is deposited on the rear-surface-side electrodes of the semiconductor elements 82 by sputtering (FIG. 10E). Thereafter, the thick-film plating layer 85 having a required thickness is formed, taking the standard current amount into consideration, to form a current wiring layer (FIG. 10F).

In addition, it is desirable that chevron-shaped protrusions formed on the connection surfaces of the leads 83a of the conductive wiring metal plate 83 are formed at an inclination angle of about 5 to 30 degrees with respect to a contact surface. The shape of the protrusions may be any shape in which edge portions are formed, such as a trapezoidal shape, an arc shape, or a wavy shape, other than the chevron shape.

As described above, an electrode on one surface is formed with the conductive wiring metal plate and an electrode on the other surface is formed with the thick-film plating, so that the conductive wiring metal plate makes it possible for wiring to be carried out by a simple process in such a case as where patterning is needed only on one surface or side. In addition, since the electrodes of the semiconductor elements and the connection surface of the conductive wiring metal plate are mediated by the edge, it is possible to sufficiently circulate a plating solution between the electrodes of the semiconductor elements and the connection surface of the conductive wiring metal plate and, therefore, it is possible to realize a high-quality plating connection without generating voids or the like.

Figure 11A:
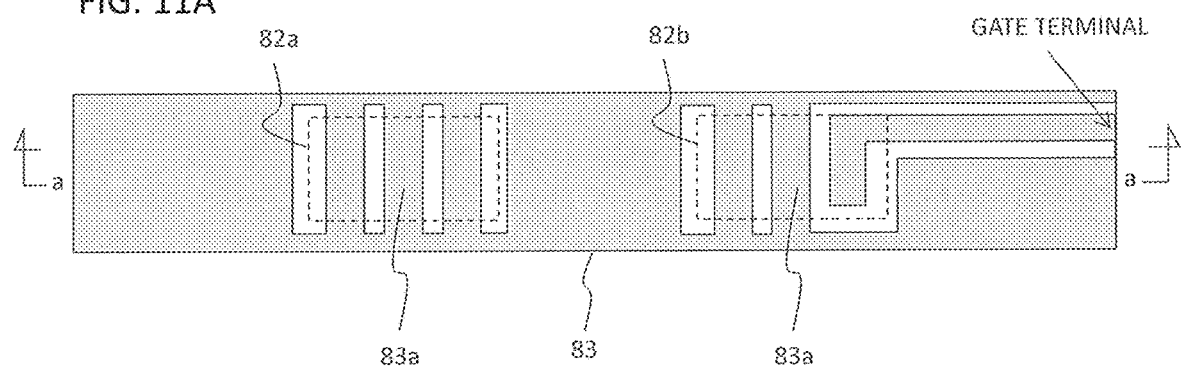
FIGS. 11A to 11C are diagrams showing a first example of another configuration of the power semiconductor module device according to the third embodiment, where
Figure 11B:
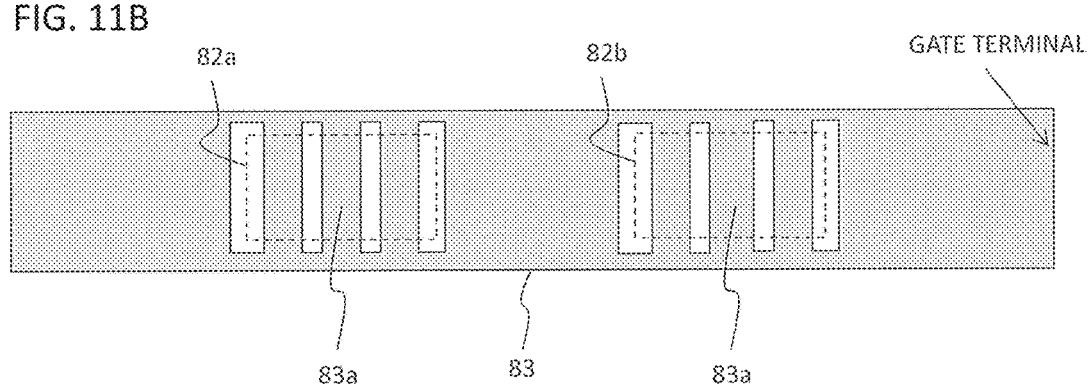
Figure 11C:
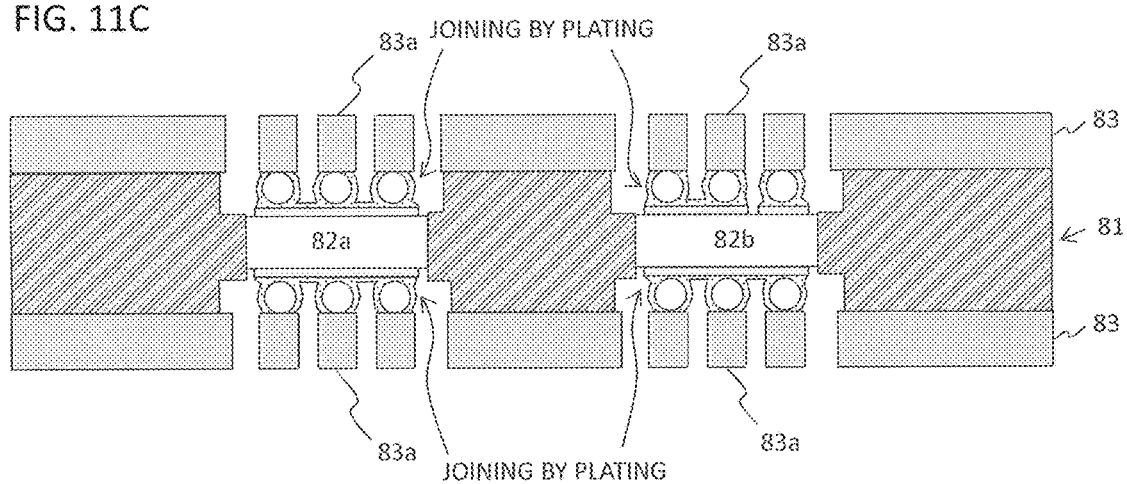
Figure 12A:
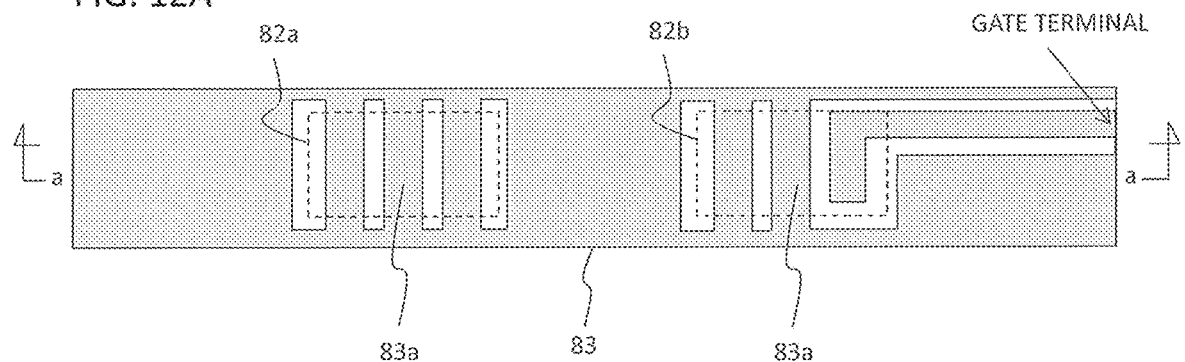
FIGS. 12A to 12C are diagrams showing a second example of the other configuration of the power semiconductor module device according to the third embodiment, where
Figure 12B:
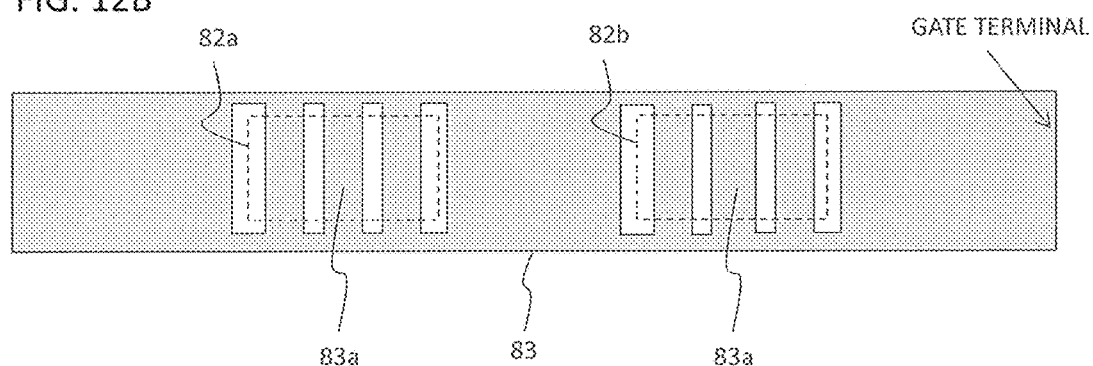
Figure 12C:
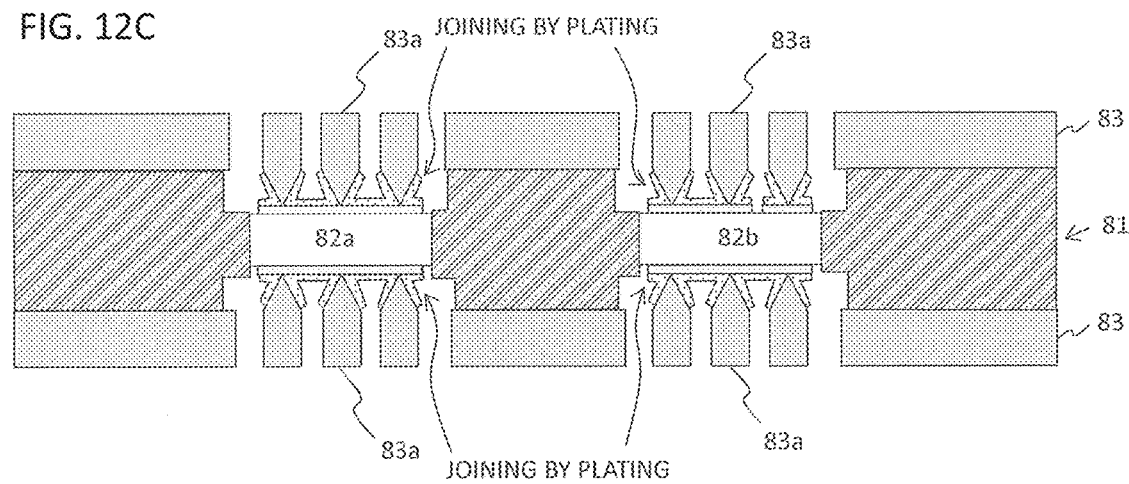

In addition, it is possible to obtain such structures that not only the front surface side but also the rear surface side are connected to the conductive wiring metal plate via the edge portions to form the current wiring layer as shown in FIGS. 11A to 11C and FIGS. 12A to 12C, for example. Here, FIGS. 11A and 12A are top views, FIGS. 11B and 12B are bottom views, and FIGS. 11C and 12C are cross-sectional views taken along the line a-a of FIGS. 11A and 12A, respectively.

Fourth Embodiment

A power semiconductor module device according to the present embodiment will be described with reference to FIG. 13. In the power semiconductor module device according to the present embodiment, a heat spreader is formed by plating on the surface of the conductive wiring metal plate 83 of the power semiconductor module device according to the above third embodiment.

In the power semiconductor module device, it is necessary not only to connect the semiconductor elements to the conductive wiring metal plate 83 but also to connect a metal (a heat spreader) having a high thermal conductivity for radiation of heat. When connecting the heat spreader to the conductive wiring metal plate 83, there is a method for connecting them by soldering. However, since solder has poor thermal conductivity, an effect of the heat spreader cannot be sufficiently exerted when solder is used between the heat spreader and the conductive wiring metal plate 83. Therefore, in the present embodiment, the heat spreader is directly formed by plating on the surface of the conductive wiring metal plate 83 without using a material having poor thermal conductivity such as solder.

Note that the plating in the present embodiment includes electrolytic plating, non-electrolytic plating, and hot-dip plating. In the electroplating or the non-electrolytic plating, the heat spreader may be formed by directly depositing plating metal on the surface of the conductive wiring metal plate 83. Further, in the hot-dip plating, the heat spreader may be formed by melting zinc or aluminum having a relatively low melting point to perform casting, or by spraying molten metal from a nozzle like a three-dimensional printer.

A method for forming the heat spreader in the power semiconductor module device according to the present embodiment will be described in detail. FIGS. 13A to 13D are stepwise cross-sectional views showing an example of the method for forming the heat spreader in the power semiconductor module device according to the present embodiment. The method for forming the heat spreader as shown in FIGS. 13A to 13D shows a method for forming the heat spreader on the surface of the conductive wiring metal plate 83 in the case where the conductive wiring metal plate 83 is arranged on the front surface side and the thick-film plating layer 85 is formed on the rear surface side as shown in FIGS. 9A and 9B. Here, the process in the case of molding the power semiconductor module device shown in FIGS. 9A and 9B with a resin and thereafter forming the heat spreader with build-up type is shown. Copper plating of a thick film, for example, is performed on the rear surface side. When the heat spreader is not formed on the rear surface side, it may not be covered with a mold resin or the resin may be removed by polishing or the like after molding.

Figure 13A:
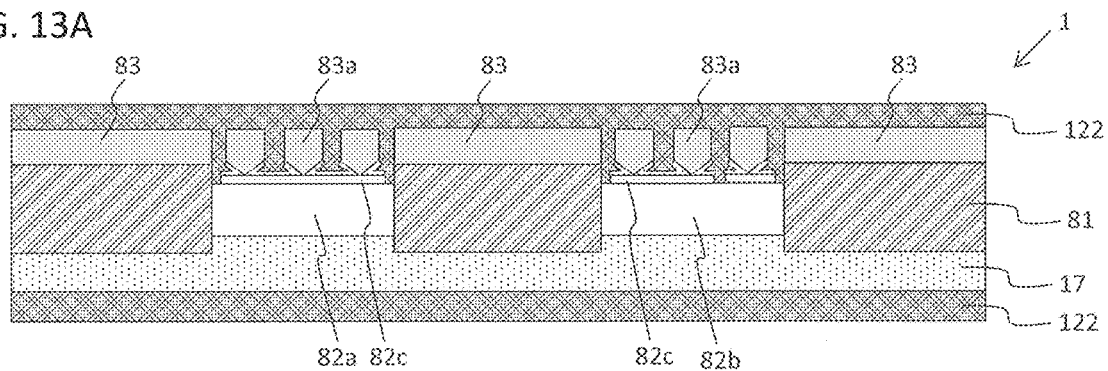
FIGS. 13A to 13D are stepwise cross-sectional views showing a method for forming a heat spreader in a power semiconductor module device according to a fourth embodiment.
Figure 13B:
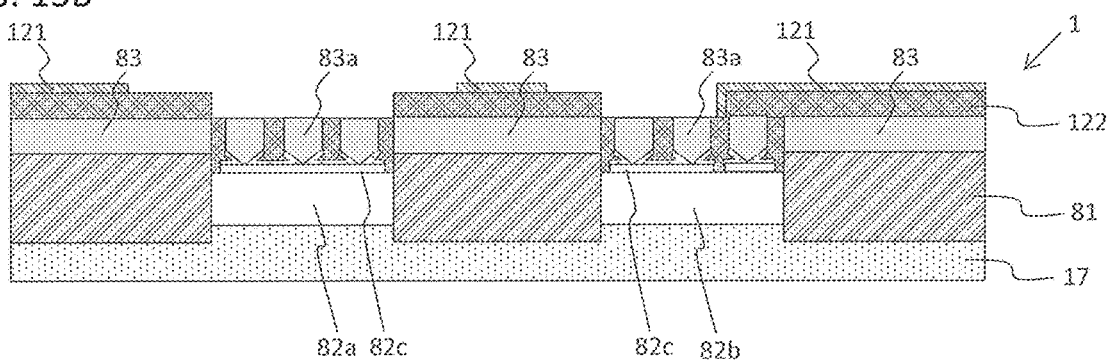
Figure 13C:
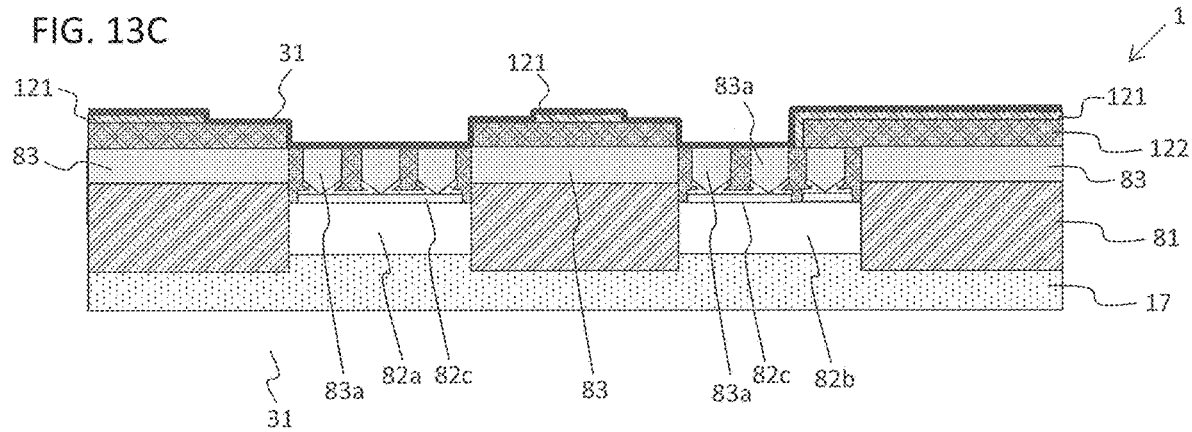
Figure 13D:
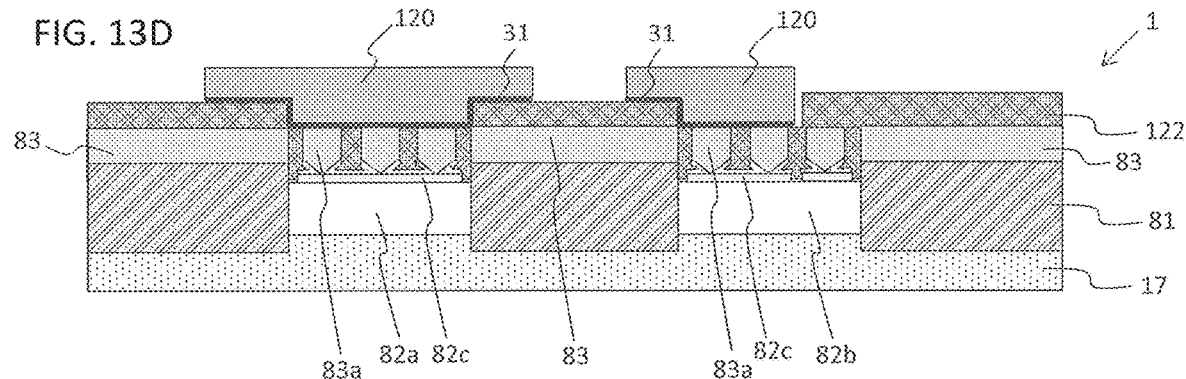

First, a power semiconductor module device 1 molded with a resin 122 is prepared (FIG. 13A), a portion of the conductive wiring metal plate 83 is drilled by a laser, and a lift-off resist 121 is applied on a portion where the heat spreader 120 is unnecessary. At this time, the resin on the rear surface side is removed by polishing (FIG. 13B). For a plating treatment, a film of Ti—Au seed 31 is formed on the front surface side of the power semiconductor module device 1 formed in FIG. 13B (FIG. 13C). The resist 121 is removed and at the same time the seed layer at the resist portion is removed. A heat spreader 120 is formed by the plating treatment (FIG. 13D). This plating treatment may use any of electrolytic plating, non-electrolytic plating, and hot-dip plating, as described above. Since the seed 31 is a metal of about 1 μm or less, it hardly causes a drop in heat radiation even if it has a lower thermal conductivity than the material of the heat spreader.

As described above, in the power semiconductor module device according to the present embodiment, the heat spreader 120 for diffusing heat is formed on the surface of the conductive wiring metal plate 83 by plating, so that it is possible to efficiently dissipate heat. Further, since the heat spreader 120 is formed by plating, it is possible to efficiently transfer heat of the conductive wiring metal plate 83 to the heat spreader 120, without solder or the like having a poor thermal conductivity between the conductive wiring metal plate 83 and the heat spreader 120.

Note that the structure and the method for forming the heat spreader according to the present embodiment can be applied to the power semiconductor module devices shown in FIGS. 8A and 8B, 11A to 11C, and 12A to 12C, other than the power semiconductor module device shown in FIGS. 9A and 9B. In particular, in the case of the power semiconductor module devices shown in FIGS. 11A to 11C and 12A to 12C, the structure of the respective rear surface sides is made similar to the structure of the front surface side of FIGS. 13A to 13D, and the process shown in FIGS. 13A to 13D is applied to these respective rear surface sides, thereby resulting in a structure in which the heat spreader is formed on both sides of the respective power semiconductor module devices. Note that it is not necessary to form the heat spreader on an electrode portion which does not require heat radiation, such as a gate electrode.

What is claimed is:

1. A power semiconductor module device comprising:
   a semiconductor element comprising a first electrode on a first surface of the semiconductor element;
   an insulating support;
   a first conductive wiring metal plate that comprises a first edge portion; and
   a second conductive wiring metal plate;
   wherein:
   the insulating support supports the semiconductor element,
   the insulating support supports the first conductive wiring metal plate on a first surface of the insulating support,
   the first conducting wiring metal plate is connected at the first edge portion to the first electrode, whereby supporting the semiconductor element from a first direction,
   the first edge portion is a wire or a ball,
   the second conductive wiring metal plate is provided on a second surface opposite to the first surface of the insulating support,
   the second conductive wiring metal plate comprises a second edge portion,
   the semiconductor element comprises a second electrode on a second surface opposite to the first surface of the semiconductor element,
   the second conducting wiring metal plate is connected at the second edge portion to the second electrode, whereby supporting the semiconductor element from a second direction opposite to the first direction, and
   the second edge portion is a wire or a ball.

2. The power semiconductor module device according to claim 1, wherein
   a heat spreader that diffuses heat is formed on a surface of the first conductive wiring metal plate by plating.

3. A power semiconductor module device comprising:
   a semiconductor element comprising a first electrode on a first surface of the semiconductor element;
   an insulating support;
   a first conductive wiring metal plate that comprises a first edge portion; and
   a plating layer;

wherein:
the insulating support supports the semiconductor element, the insulating support supports the first conductive wiring metal plate on a first surface of the insulating support,
the first conducting wiring metal plate is connected at the first edge portion to the first electrode, whereby supporting the semiconductor element from a first direction,
the first edge portion is a wire or a ball, and
the plating layer is provided by plating on a second surface opposite to the first surface of the semiconductor element that electrically connects a second electrode provided on a second surface opposite to the first surface of the semiconductor element whereby supporting the semiconductor element.

4. The power semiconductor module device according to claim 3, wherein
a heat spreader that diffuses heat is formed on a surface of the first conductive wiring metal plate by plating.

5. A power semiconductor module device comprising:
a semiconductor element comprising a first electrode on a first surface of the semiconductor element;
an insulating support;
a first conductive wiring metal plate that comprises a first edge portion; and
a second conductive wiring metal plate;
wherein:
the insulating support supports the first semiconductor element,
the insulating support supports the first conductive wiring metal plate on a first surface of the insulating support,
the first conducting wiring metal plate is connected at the first edge portion to the first electrode, whereby supporting the first semiconductor element from a first direction,
the first edge portion is in a chevron, a trapezoidal, an arc or a wavy shape,
the second conductive wiring metal plate is provided on a second surface opposite to the first surface of the insulating support, the second conductive wiring metal plate comprises a second edge portion,
the semiconductor element comprises a second electrode on a second surface opposite to the first surface of the semiconductor element,
the second conducting wiring metal plate is connected at the second edge portion to the second electrode, whereby supporting the semiconductor element from a second direction opposite to the first direction, and
the second edge portion is in a chevron, a trapezoidal, an arc or a wavy shape.

6. The power semiconductor module device according to claim 5, wherein
a heat spreader that diffuses heat is formed on a surface of the first conductive wiring metal plate by plating.

7. A power semiconductor module device comprising:
a semiconductor element comprising a first electrode on a first surface of the semiconductor element;
an insulating support;
a first conductive wiring metal plate that comprises a first edge portion; and
a plating layer;
wherein:
the insulating support supports the first semiconductor element, the insulating support supports the first conductive wiring metal plate on a first surface of the insulating support,
the first conducting wiring metal plate is connected at the first edge portion to the first electrode, whereby supporting the first semiconductor element from a first direction,
the first edge portion is in a chevron, a trapezoidal, an arc or a wavy shape, and
the plating layer is provided by plating on a second surface opposite to the first surface of the semiconductor element that electrically connects a second electrode provided on a second surface opposite to the first surface of the semiconductor element whereby supporting the semiconductor element.

8. The power semiconductor module device according to claim 7, wherein
a heat spreader that diffuses heat is formed on a surface of the first conductive wiring metal plate by plating.

* * * * *